(12) United States Patent
Takami et al.

(10) Patent No.: US 7,663,082 B2
(45) Date of Patent: *Feb. 16, 2010

(54) PHOTOELECTRIC CONVERSION DEVICE FOR REDUCING RADIATION NOISE ON LARGE SCREEN SENSORS

(75) Inventors: Eiichi Takami, Kanagawa-ken (JP); Noriyuki Kaifu, Tokyo (JP); Kenji Kajiwara, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/618,057

(22) Filed: Dec. 29, 2006

(65) Prior Publication Data
US 2007/0108372 A1  May 17, 2007

Related U.S. Application Data

(62) Division of application No. 10/057,898, filed on Jan. 29, 2002, now Pat. No. 7,164,112, which is a division of application No. 09/055,247, filed on Apr. 6, 1998, now Pat. No. 6,384,393.

(30) Foreign Application Priority Data

Apr. 10, 1997 (JP) .................. 9-106843
Mar. 26, 1998 (JP) .................. 10-096958

(51) Int. Cl.
*H01L 27/00* (2006.01)
*G01T 1/24* (2006.01)

(52) U.S. Cl. .............. 250/208.1; 250/370.09; 250/370.11

(58) Field of Classification Search ............ 250/208.1, 250/370.09, 370.11
See application file for complete search history.

(56) References Cited

U.S. PATENT DOCUMENTS

| 4,233,514 | A | | 11/1980 | Kingsley ............. 250/370 |
| 4,288,264 | A | * | 9/1981 | Haque ............... 156/67 |
| 4,350,886 | A | | 9/1982 | Pommerrenig ....... 250/239 |
| 4,491,732 | A | * | 1/1985 | Pritzkow et al. ...... 250/366 |
| 4,672,454 | A | | 6/1987 | Cannella et al. ..... 358/213.11 |
| 4,734,588 | A | * | 3/1988 | Akai ............... 250/370.11 |
| 4,745,488 | A | | 5/1988 | Kaifu et al. ......... 358/294 |
| 4,926,058 | A | | 5/1990 | Iwamoto et al. ..... 250/578.1 |
| 4,943,727 | A | | 7/1990 | Kitada et al. ....... 250/483.1 |
| 4,991,190 | A | * | 2/1991 | Mori ................. 378/9 |
| 5,060,040 | A | | 10/1991 | Saika et al. .......... 357/30 |
| 5,233,442 | A | | 8/1993 | Kawai et al. ........ 358/482 |
| 5,272,548 | A | | 12/1993 | Kawai et al. ........ 358/482 |

(Continued)

FOREIGN PATENT DOCUMENTS

EP     0 529 981 A2    3/1993

(Continued)

*Primary Examiner*—Thanh X Luu
(74) *Attorney, Agent, or Firm*—Fitzpatrick, Cella, Harper & Scinto

(57) ABSTRACT

For providing a photoelectric conversion device that can prevent radiation noise by a low-cost and simple mounting method, the photoelectric conversion device having a photoelectric conversion element is provided in which a conductive member such as a thin metal sheet is stuck on the photoelectric conversion element.

20 Claims, 12 Drawing Sheets

U.S. PATENT DOCUMENTS

| | | | |
|---|---|---|---|
| 5,317,406 A | 5/1994 | Kobayashi et al. | 348/307 |
| 5,335,094 A | 8/1994 | Kaifu et al. | 358/494 |
| 5,550,380 A * | 8/1996 | Sugawara et al. | 250/370.11 |
| 5,635,718 A | 6/1997 | DePuydt et al. | 250/370.09 |
| 5,804,832 A | 9/1998 | Crowell et al. | 250/580 |
| 5,812,109 A | 9/1998 | Kaifu et al. | 345/104 |
| 5,812,284 A | 9/1998 | Mizutani et al. | 358/482 |
| 5,841,180 A | 11/1998 | Kobayashi et al. | 257/448 |
| 5,914,485 A | 6/1999 | Kobayashi et al. | 250/208.1 |
| 6,034,406 A | 3/2000 | Kobayashi et al. | 257/435 |
| 6,127,684 A | 10/2000 | Kaifu | 250/370.09 |
| 6,191,411 B1 | 2/2001 | Kaifu | 250/214 |
| 6,295,390 B1 | 9/2001 | Kobayashi et al. | 382/313 |
| 6,384,393 B2 | 5/2002 | Takami et al. | 250/208.1 |
| 6,456,748 B1 | 9/2002 | Yushiya et al. | 382/312 |
| 6,476,867 B1 | 11/2002 | Kobayashi et al. | 348/307 |
| 2001/0012070 A1 | 8/2001 | Enod et al. | 348/302 |

FOREIGN PATENT DOCUMENTS

| | | |
|---|---|---|
| EP | 0 528 676 B1 | 4/1997 |
| JP | 55-104776 | 8/1980 |
| JP | 58-118977 | 7/1983 |
| JP | 60-142300 | 7/1985 |
| JP | 63-86472 | 4/1988 |
| JP | 2-21285 | 1/1990 |
| JP | 3-130693 | 6/1991 |
| JP | 07-280944 | 10/1995 |
| JP | 8-201525 | 8/1996 |

* cited by examiner

PHOTOELECTRIC CONVERSION DEVICE FOR REDUCING RADIATION NOISE ON LARGE SCREEN SENSORS

This application is a Division of application Ser. No. 10/057,898, filed Jan. 29, 2002, which in turn is a Division of application Ser. No. 09/055,247, filed Apr. 6, 1998, now issued as U.S. Pat. No. 6,384,393.

BACKGROUND OF THE INVENTION

1. Field of the Invention

The present invention relates to a photoelectric conversion device, and more particularly, relates to a photoelectric conversion device having a two-dimensional photoelectric conversion region suitably used for reading (particularly, for reading with 1:1 magnification), for example, in facsimile machines, digital copiers, X-ray imaging apparatuses for nondestructive inspection, or the like.

2. Related Background Art

There are conventionally known those reading devices which use a reducing (demagnifying) optical system and a CCD type sensor as image reading devices for facsimile machines, copiers, scanners, or X-ray imaging apparatuses (so-called roentgen apparatus). With the development of photoelectric conversion semiconductor materials typified by hydrogenated amorphous silicon (hereinafter referred to as a-Si), development is remarkable of so-called contact type sensors in which a photoelectric conversion element and a signal processing portion are formed on a large-area substrate and in which an image of an information source is read by an optical system having the 1:1 (1×) magnification relative to the information source. For reading an X-ray image, X-rays are guided into a wavelength converting member such as a fluorescent member to be converted to light of wavelengths in a sensitive wavelength range of the sensor and the light is read by the sensor. Since there are optical losses in the image reading using the demagnifying optical system, the reading efficiency is intended to be increased by the contact reading with the wavelength converting member and the sensor of one magnification.

Particularly, since the a-Si is not used only as a photoelectric conversion material but is also used as a material for a thin-film field-effect transistor (hereinafter referred to as TFT), and since it thus has the advantage of capability of simultaneous formation of semiconductor layers for photoelectric conversion and for TFT, it demonstrates good matching with capacitive elements and switching elements such as TFT formed together. These elements can be formed by stacking of thin films and the stacking order of the respective thin films of these elements can be made the same. This configuration permits the thin films forming the respective elements to be formed simultaneously as common films. This simultaneous formation of the elements decreases the number of production steps and the length of routing of wires, whereby the photoelectric conversion device can be made with high SN ratio and at low cost.

Also, the capacitive elements (capacitors) can be made with good characteristics, because an insulating layer is provided as an intermediate layer between conductive layers to become electrodes. The improvement in the characteristics of the capacitive elements also realizes a highly functional photoelectric conversion device capable of outputting integral values of optical information obtained by a plurality of photoelectric conversion elements by a simple structure and also allows configurations of facsimiles and X-ray roentgen apparatuses with a large area, a high-level function, and high characteristics at low cost.

In such large-screen sensors with high characteristics, however, because of their large screen and large area, there were some cases where increase in radiation noise caused noise voltage or noise current to enter the photoelectric conversion semiconductor layers and the TFT semiconductor layers and to cause an error operation or an error signal, thereby extremely degrading the reliability of the photoelectric conversion device.

The means as shown in FIG. 1 is sometimes employed as a countermeasure against the radiation noise as discussed above.

FIG. 1 is a schematic, cross-sectional view of a photoelectric conversion device used for X-ray detection. In this photoelectric conversion device, on a photoelectric conversion device 21 having a photoelectric conversion element and TFT, there is formed a metal film 26 for formation of so-called antenna earth, as a measure for preventing the radiation noise from entering the device, by vacuum vapor deposition or the like. Numeral 23 designates a fluorescent screen for sensing X-rays, which is stuck on the metal film 26 with an adhesive 24.

It is, however, undeniable that the metal film formed by vacuum vapor deposition or the like is disadvantageous in terms of the cost. There is also room for improvement in terms of the yield.

Further, it is impossible to perfectly eliminate fine dust during fabrication of the photoelectric conversion semiconductor layers, particularly two types of dust that poses a problem; dust particles peeled off from the inner wall of a thin-film deposition apparatus during deposition of an amorphous silicon layer on the substrate; and dust particles remaining on a substrate during deposition of a metal layer on the substrate.

In addition to the circumstance that it was originally impossible to perfectly eliminate the defective condition of wire, i.e., short or open of wire, there arises the problem that the method for forming the metal film by vacuum vapor deposition or the like, and patterning it to effect wiring in order to form the antenna earth for preventing the radiation noise from entering the device would be a factor that further lowers the yield of the substrates and raises the cost in production of a large-screen photoelectric conversion device.

If the metal film is provided on the light incidence side of the photoelectric conversion portion, it will necessitate consideration on decrease in quantity of incident light due to the metal film. In order to minimize the decrease of efficiency due to this metal film, it is also conceivable to form a transparent, conductive film of a metal oxide or the like. This, however, forces more difficult formation of films and thus does not substantially solve the above problem.

As described above, the countermeasure against the radiation noise becomes more important with increase in the light-receiving area and for obtaining information with higher SN ratios.

Further, there is a need for a countermeasure which can surely prevent the radiation noise without accompanying significant increase of cost and lowering of yield.

From another aspect, the wavelength converting member such as the fluorescent screen is often rather vulnerable to an external factor such as humidity. There is, therefore, the desire for protection of the wavelength converting member in order to enhance the durability, handleability, and maintainability of the photoelectric conversion device for X-ray detection.

SUMMARY OF THE INVENTION

The present invention has been accomplished in view of the above problems and an object of the present invention is to provide a photoelectric conversion device that can surely prevent the effect of radiation noise on the large-screen sensor such as the contact type sensor having mounted photoelectric conversion elements as two-dimensionally arrayed at equal intervals, by a low-cost and simple mounting structure without depositing films.

Another object of the present invention is to provide a photoelectric conversion device with a high SN ratio and also to provide a photoelectric conversion device with excellent environment resistance.

A further object of the present invention is to provide a photoelectric conversion device that can prevent deterioration of the wavelength converting member such as the fluorescent member, due to humidity, water, or the like, thereby permitting stable reading.

Another object of the present invention is to provide a photoelectric conversion device comprising a photoelectric conversion element formed on a substrate and a conductive member provided by sticking (i.e., lamination) on the photoelectric conversion element.

In the present invention, by providing by sticking on a photoelectric conversion element comprising a semiconductor material capable of photoelectric conversion or the like as a component, a conductive member having at least a conductive layer such as a thin metal sheet (of course, the conductive member may have only the conductive layer), the above-mentioned problems can be solved to provide a photoelectric conversion device with a sufficiently high SN ratio, high reliability, and sufficient durability.

Since the present invention involves no need for an advanced process during the step of providing the conductive material, the invention can provide a more inexpensive photoelectric conversion device with high cost performance and in a higher yield.

In the photoelectric conversion device of the present invention, a wavelength converting member is preferably provided between the photoelectric conversion element and the conductive member, and the wavelength converting member may comprise a fluorescent member.

In the photoelectric conversion device of the present invention, the conductive member may have an insulating base and a conductive layer provided on the base, and the device may further comprise a protective material on a surface of the conductive layer on the opposite side of the base.

Such a conductive layer (or conductive member) is preferably of a metal and aluminum can be used suitably as the metal.

In the photoelectric conversion device of the present invention, the conductive member preferably has a wider area than an area in which the photoelectric conversion element is formed.

In the photoelectric conversion device of the present invention, particularly, when the device has a wavelength converting member, edge portions of the conductive layer and the wavelength converting member are preferably sealed with a resin; the conductive layer may be provided so as to cover the edge portions of the wavelength converting member; the conductive layer may be provided so as to contact the edge portions of the wavelength converting member and cover the wavelength converting member.

The conductive layer is preferably sealed with a resin so as to isolate the wavelength converting member from the outside in a circumferential region of the wavelength converting member.

Although the structure of the photoelectric conversion element is not specifically limited, it is preferable to adopt the constitution in which many photoelectric conversion elements are arranged in a matrix, and it is also preferable that the photoelectric conversion elements be arranged substantially at equal intervals.

DESCRIPTION OF THE PREFERRED EMBODIMENTS

The present invention will be described by reference to the accompanying drawings as occasion may demand.

Figure 2:
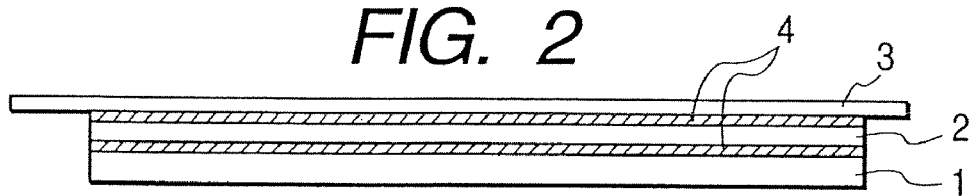
FIG. 2 is a schematic, cross-sectional view for explaining another example of a photoelectric conversion device.

FIG. 2 is a schematic, cross-sectional view of an example of a photoelectric conversion device capable of reading an X-ray image, in which an X-ray image on a fluorescent member radiating light with reception of X-rays traveling through an object is electrically read by a photoelectric conversion element.

The photoelectric conversion device of the present invention generally concerns the contact sensors of the 1:1 reading type with a photoelectric conversion layer comprising a material capable of photoelectric conversion such as a-Si, particularly all two-dimensional sensors, but the device will be described with typical examples of application as image information reading means of the X-ray roentgen apparatus (X-ray imaging apparatus).

FIG. 2 shows an example of a photoelectric conversion device in which a fluorescent screen 2 for converting X-rays into light of wavelengths in the photosensitive region of a photoelectric conversion element 1 is stuck with an adhesive 4 on a surface of the photoelectric conversion element 1 which forms a large-area sensor and in which a thin metal sheet 3 for prevention of external radiation noise is further stuck on the fluorescent screen 2 with the adhesive 4.

This photoelectric conversion device is formed in such a manner that the photoelectric conversion elements and the thin-film field-effect transistors (TFTs) for switches are formed of a photoelectric conversion semiconductor material typified, for example, by a-Si, on a common substrate and that a plurality of contact type sensors for reading an image of a so-called information source through an optical system having the magnification of 1 to the information source are two-dimensionally constructed of the substrate on which the photoelectric conversion semiconductor layer and the TFT semiconductor layer are formed at the same time.

In order to prevent the noise voltage or noise current due to the radiation noise from entering the photoelectric conversion semiconductor layer 1 and the semiconductor layer of TFT and from greatly degrading the reliability of the photoelectric conversion device because of the error operation or the error signal, the thin metal sheet 3 laminated on a base sheet (not shown) of a resin or the like, for example, is stuck on the surface of the photoelectric conversion element 1 without any wrinkle or stripe, and the thin metal sheet 3 is connected to the earth or to electric ground.

Figure 3:
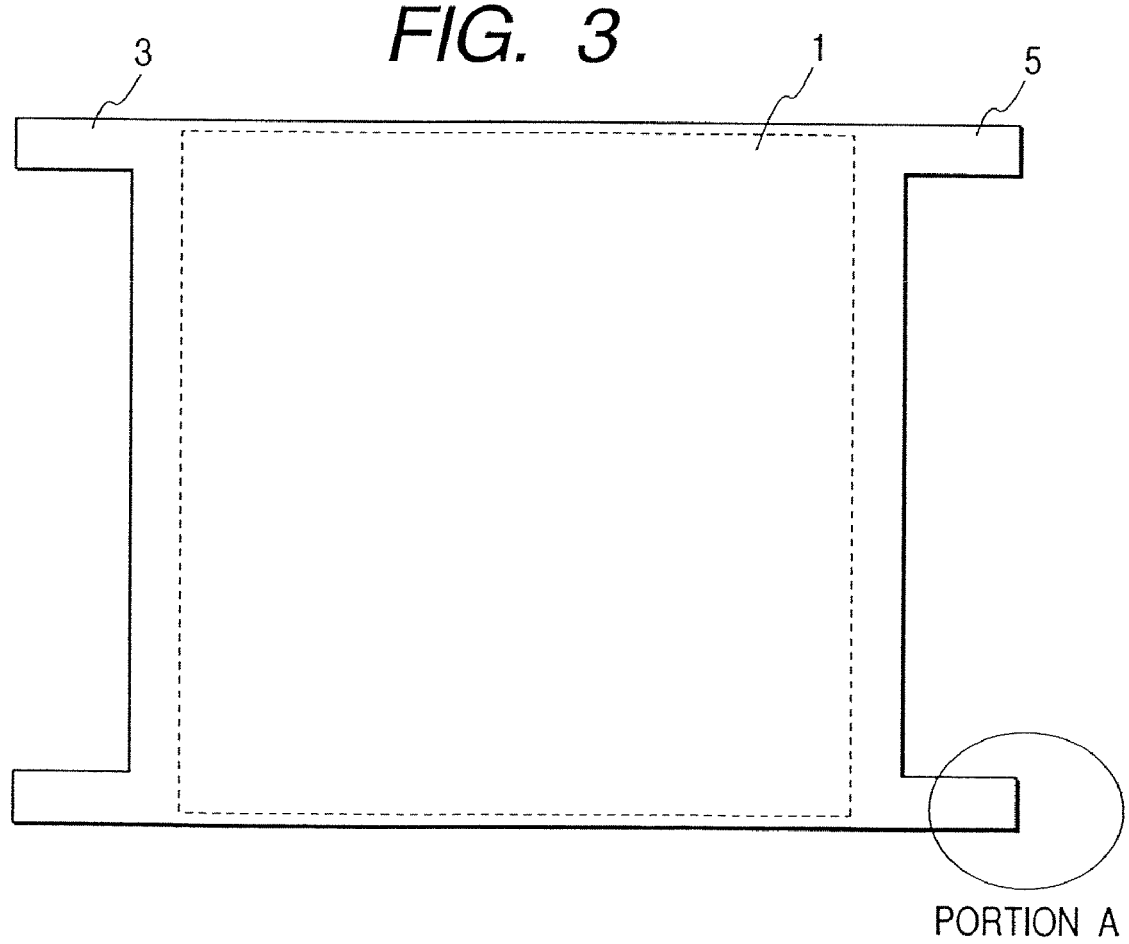
FIG. 3 is a schematic, plan view for explaining an example of the positional relation between a conductive member and a photoelectric conversion portion in a photoelectric conversion device.

The photoelectric conversion device will be described in further detail by reference to the schematic, plan view of FIG. 3.

The thin metal sheet 3 for prevention of noise is stuck on the surface of the photoelectric conversion element 1 with the adhesive 4; particularly, in the case of the X-ray roentgen apparatus, the thin metal sheet 3 needs to be made of a metal that can transmit X-rays readily and in a smaller thickness in order to reduce X-ray losses. On the other hand, the thinner the thin metal sheet 3, the more difficult the sticking without any wrinkle or stripe. It is thus preferred, for example, to employ the thin metal sheet 3 laminated on a base sheet of a resin or the like so as to increase the strength of the thin metal sheet 3. Sticking in this state facilitates sticking without any wrinkle or stripe. The thin metal sheet 3 is then connected to the earth or to the electric ground.

In view of the easiness of sticking as described above, it is preferred that at least one surface of the thin metal sheet 3 is laminated with a resin film. Further, the thin metal sheet 3 may have a protective film for protecting the resin film as the base and the metal surface from mechanical damage or from other substances including water. In this case, it is preferred to cover the both surfaces of the thin metal sheet with a resin. There is no specific limitation on materials for the base and for the protective film, and they may be made either of a common material or of different materials as long as they have desired properties.

The thin metal sheet to become a conductive layer may be of a so-called foil shape or of a film formed on a base by vapor deposition. In this case, the vapor deposition on a base can more easily be performed than the formation on the photoelectric conversion elements, because the degree of flatness is higher (the surface does not have unevenness due to the photoelectric conversion elements), and because the film can be formed under optimum conditions to the base.

Further, the resin for the base or the resin for protection can also be formed by a method except for lamination, for example by coating.

When consideration is given to the electrical insulation from the photoelectric conversion elements, the surface of the metal may be oxidized to form an oxide. As an example of the metal having high X-ray transmittance and readily forming a thin film, aluminum (Al) may be employed preferably. Further, oxidizing aluminum can easily enhance the surface strength thereof.

Although the thickness of the thin metal sheet is selected depending upon circumstances and material used, it is desirably not more than 100 μm in the case of aluminum in consideration of the above points.

In the specification and claims, the member including the thin metal sheet provided on the photoelectric conversion elements as described above will be generally called a conductive member.

Figure 1:
FIG. 1 is a schematic, cross-sectional view for explaining an example of a photoelectric conversion device.

The total area of the noise preventing plate including the thin metal sheet is preferably at least larger than the area of the surface of the photoelectric conversion element 1. Parts of the plate are provided with terminals of earth connecting portions 5 of the thin metal sheet 3 for wiring to the earth or to the electric ground in the region outside the photoelectric conversion element surface 1 as shown in FIG. 3, and the thin metal sheet 3 is connected to the earth or to the electric ground by thread fastening or eyelet. In that case, portion A indicates a portion including the terminal portion of the thin metal sheet of the earth connecting portion 5 and the both-side laminate thereof. FIG. 1 and FIG. 2 show the photoelectric conversion device for X-ray image, but, in the case of a contact type image sensor for an ordinary scanner, the fluorescent screen 2 is unnecessary.

Figure 4:
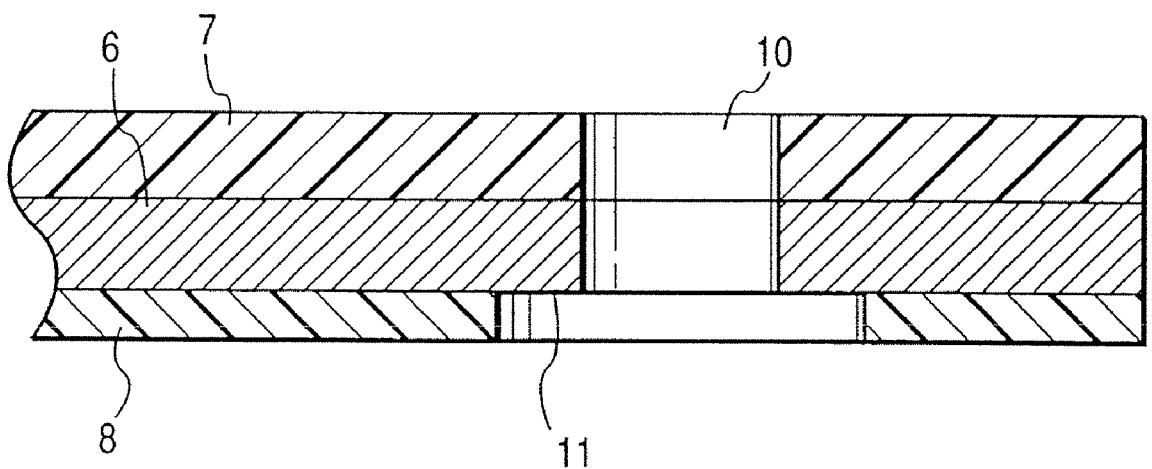
FIG. 4 is a schematic, cross-sectional view for explaining an example of the structure of a conductive member.

In actual wiring to the earth, as shown in the schematic, enlarged, cross-sectional view of the earth connecting portion of FIG. 4, a base resin film 7 and a protective resin film 8 are placed on either side of a thin metal sheet 6 (which is the same as the thin metal sheet 3 of FIG. 2) to form a laminate and the base resin film 7 is a film having the thickness equal to or larger than that of the protective resin film 8. The thin metal sheet 6 stuck with the resin films on the both sides is provided with a hole 10 for the connection to the ground. A screw, vis, or the like is put in the hole 10 and is screwed into an earth terminal or the like. A part of the protective resin film 8 is peeled off in contact portion 11 to contact the earth terminal or the like.

Figure 5:
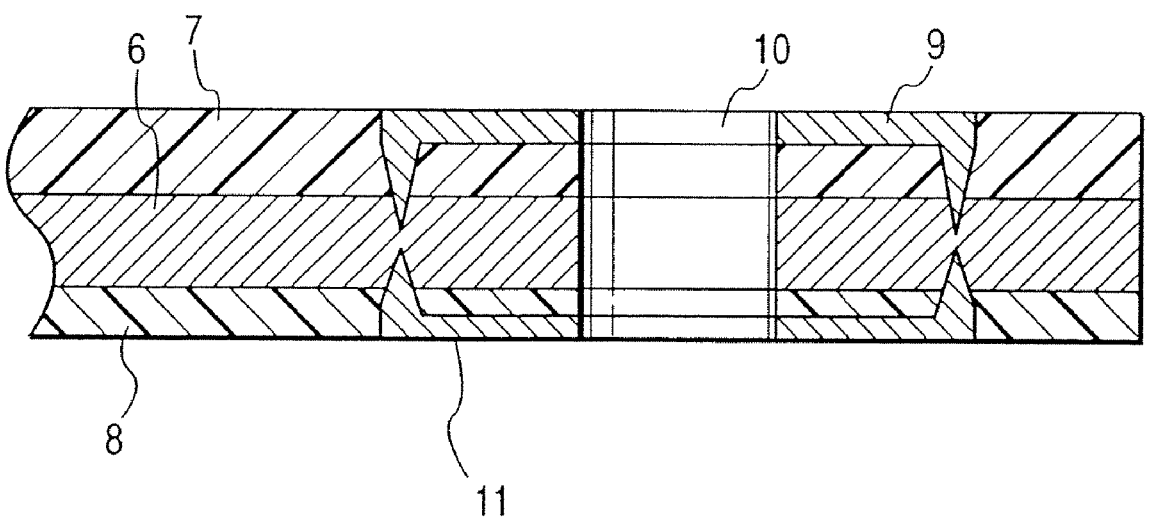
FIG. 5 is a schematic, cross-sectional view for explaining another example of the structure of a conductive member.

Another preferred example is shown in FIG. 5. FIG. 5 shows an example in which annular metal members having projections on one side thereof (for example, eyelets) are mounted in the earth connecting portion to be connected to the earth terminal. In FIG. 5, as with the example shown in FIG. 4, the base resin film 7 and the protective resin film 8 are placed on either side of the thin metal sheet 6 to form a laminate and the base resin film 7 is a resin film having a thickness equal to or larger than that of the protective resin film 8. For grounding of the laminated thin metal sheet 6 with the resin films on the both sides, the hole 10 is made by an eyelet punch or the like in this example. Further, the projecting portions of the annular metal members (for example, eyelets) 9 partly break into the resin films 7, 8 to achieve connection between the metal members (eyelets) 9 and the thin metal sheet 6, whereby the metal members (eyelets) 9 themselves serve as a connection terminal on the resin films on the both sides.

Figure 6:
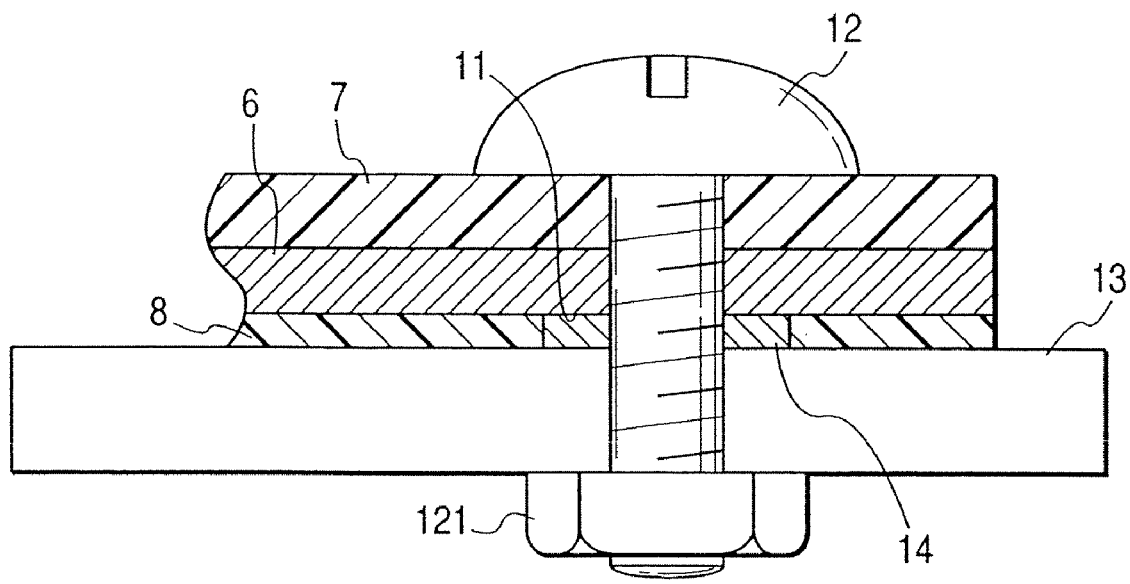
FIG. 6 is a schematic, partial, cross-sectional view for explaining an example of electrical connection of a conductive member.
Figure 7:
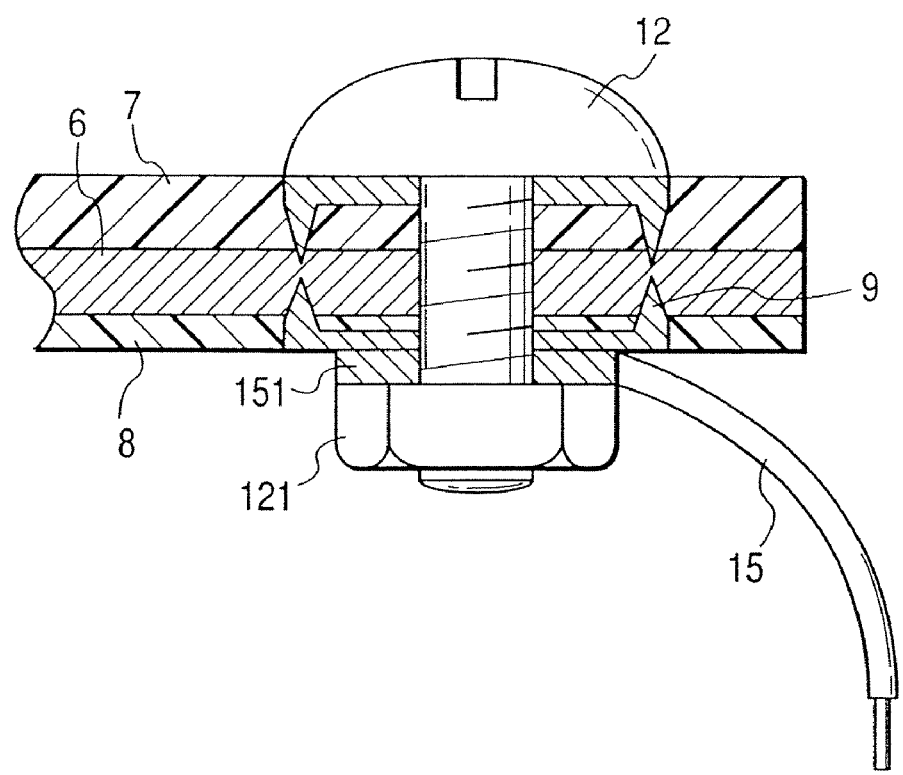
FIG. 7 is a schematic, partial, cross-sectional view for explaining anther example of electrical connection of a conductive member.

The actual connection with the earth terminal is shown in FIG. 6 for the case of the screwing structure of FIG. 4 and in FIG. 7 for the case of the eyelets of FIG. 5.

As shown in FIG. 6, a fastening member 12 such as a screw is put into the hole 10 and is coupled with a threaded coupling member 121 such as a nut so that the contact portion 11 can be electrically connected to electric circuit board 13 having the earth terminal. In the illustrated example a contact terminal 14 such as a metal washer or solder is provided for ensuring the electrical connection between the thin metal sheet 6 and the earth terminal. The contact terminal 14, however, does not always have to be given if the sufficient electrical connection is assured. The electrical connection is achieved by rotating and fixing the fastening member 12 with respect to the coupling member 121, but the fastening method is not limited to the method in this illustrated example.

As shown in FIG. 7, conduction may also be attained by utilizing the metal members (eyelet metal plates) 9 and mounting a connection terminal 151 such as a washer connected to a conductor wire of a grounding cable 15 by means of the fastening member 12 and the coupling member 121.

Of course, the methods shown in FIG. 6 and FIG. 7 can be modified if necessary; for example, the grounding cable 15 and connection terminal 151 as shown in FIG. 7 may be applied to the method of FIG. 6; or the electric circuit board 13 and connection terminal 14 as shown in FIG. 6 may be applied to the method of FIG. 7 to achieve conduction.

The electric circuit board 13 may be the substrate in which the photoelectric conversion elements are formed, of course. Specific preferred examples of connected portions will be described below.

Figure 8:
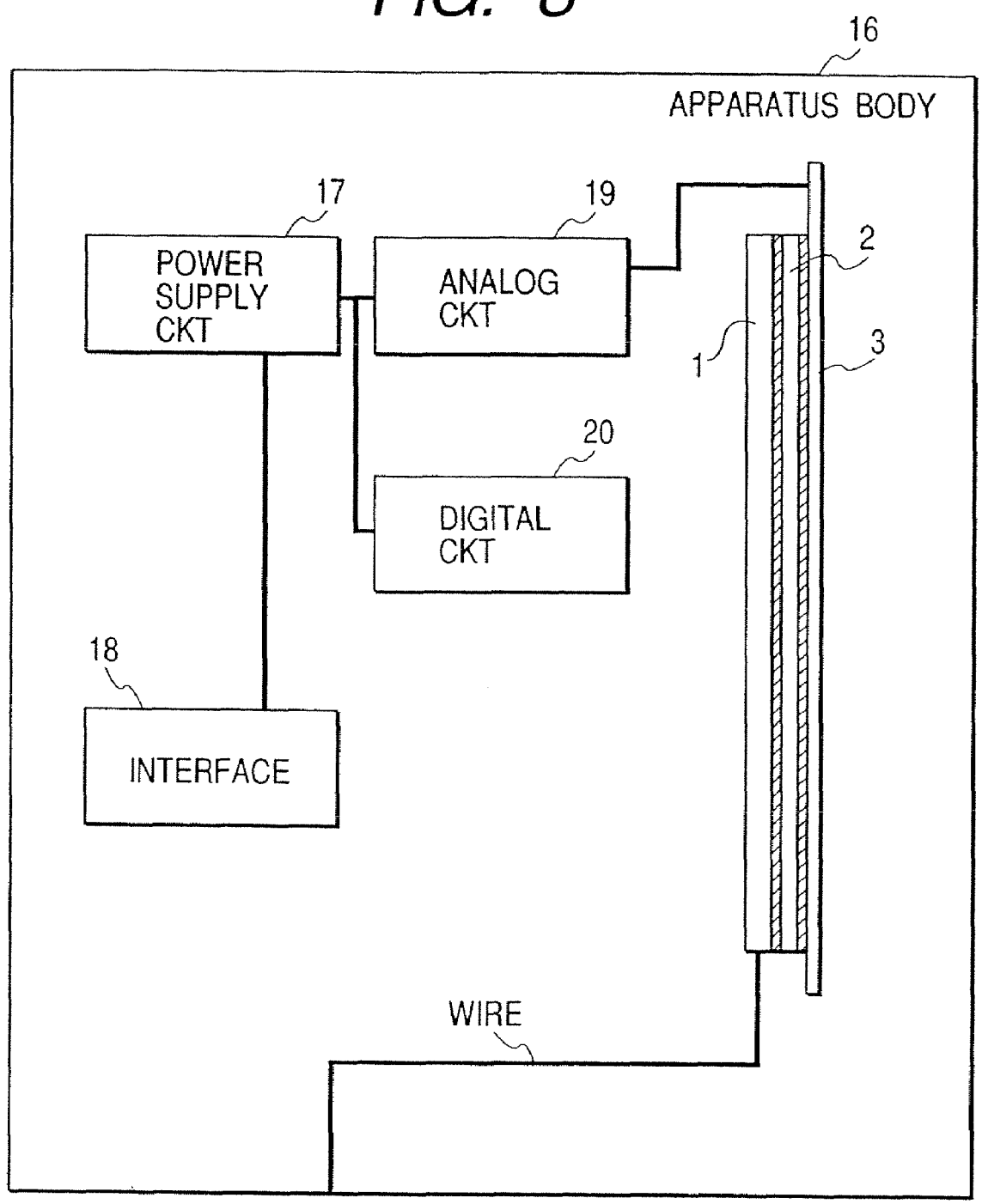
FIG. 8 is a schematic block diagram for explaining an example of electrical connection of a conductive member.

FIG. 8 is a schematic block diagram to show an example where the grounding point is connected to the apparatus body. In FIG. 8, the apparatus body (or housing) 16 has a power-supply circuit 17 for supplying a power to each portion, an interface 18 for input/output of a signal to or from an external apparatus, an analog circuit 19 for indicating an X-ray image based on analog electric signals by reading the X-ray image from the photoelectric conversion device and for outputting the X-ray image or the like, a digital circuit 20 for performing A/D conversion of the X-ray image signals from the analog circuit 19 to perform a digital image processing thereof and for thereafter returning the digital signals to the analog circuit 19, and the photoelectric conversion device of the laminate substrate type in which the fluorescent screen 2 sensitive to X-rays is stuck on a surface of the photoelectric conversion element 1 with an adhesive and in which the thin metal sheet 3 for prevention of radiation noise is further stuck thereon. The thin metal sheet 3 of the photoelectric conversion device is connected to the apparatus body 16 as the earth, which can prevent the radiation noise from entering the photoelectric conversion device.

Figure 9:
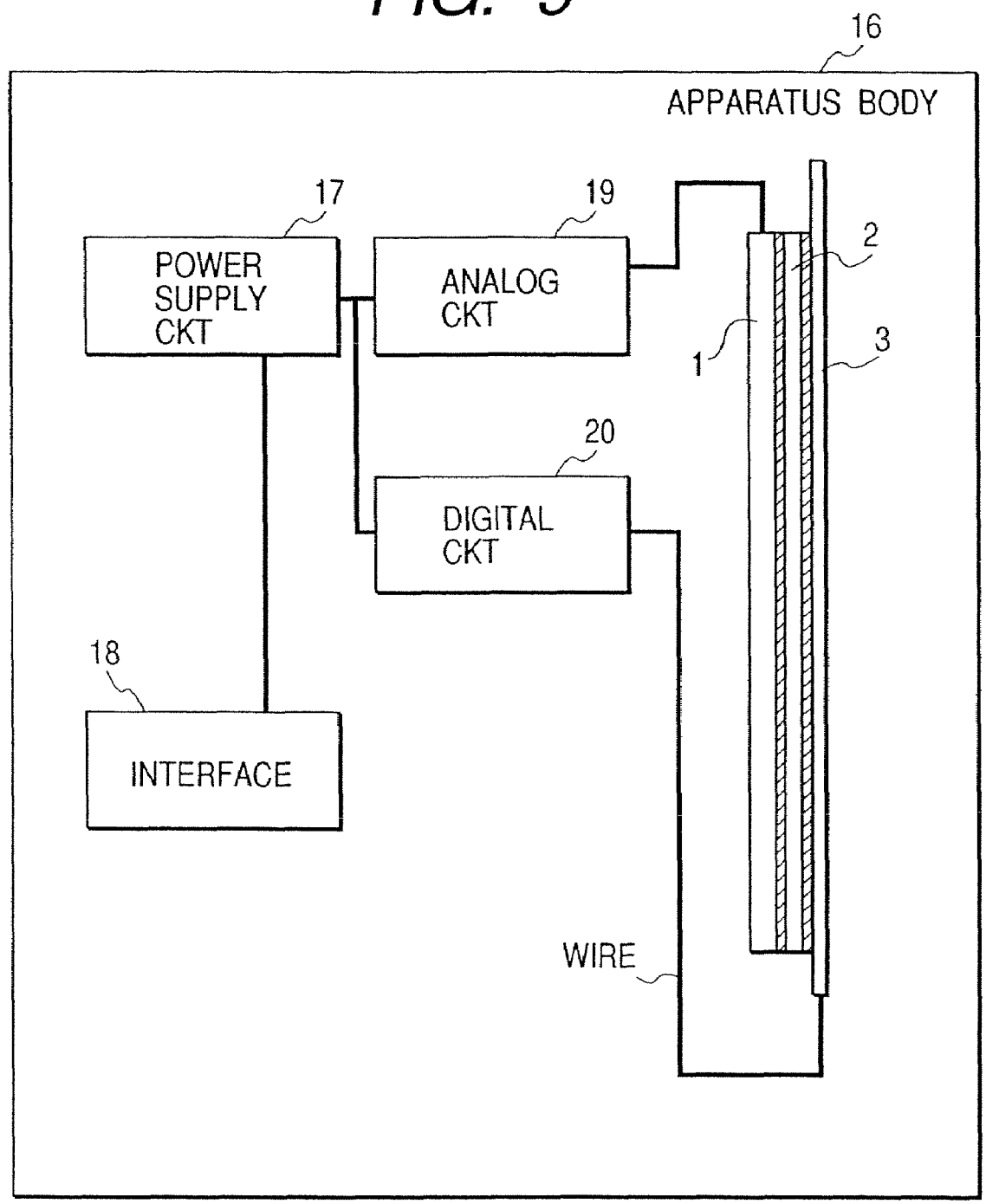
FIG. 9 is a schematic block diagram for explaining another example of electrical connection of a conductive member.

FIG. 9 is a schematic block diagram to show an example in which the earth terminal is connected to the digital circuit 20.

In the example shown in FIG. 9, the thin metal sheet 3 of the photoelectric conversion device is connected to the ground wire of the digital circuit 20 as the earth. This is particularly suitable for the cases where the photoelectric conversion device is disposed close to the digital circuit 20 or where the two devices have an electrically equal earth potential.

Figure 10:
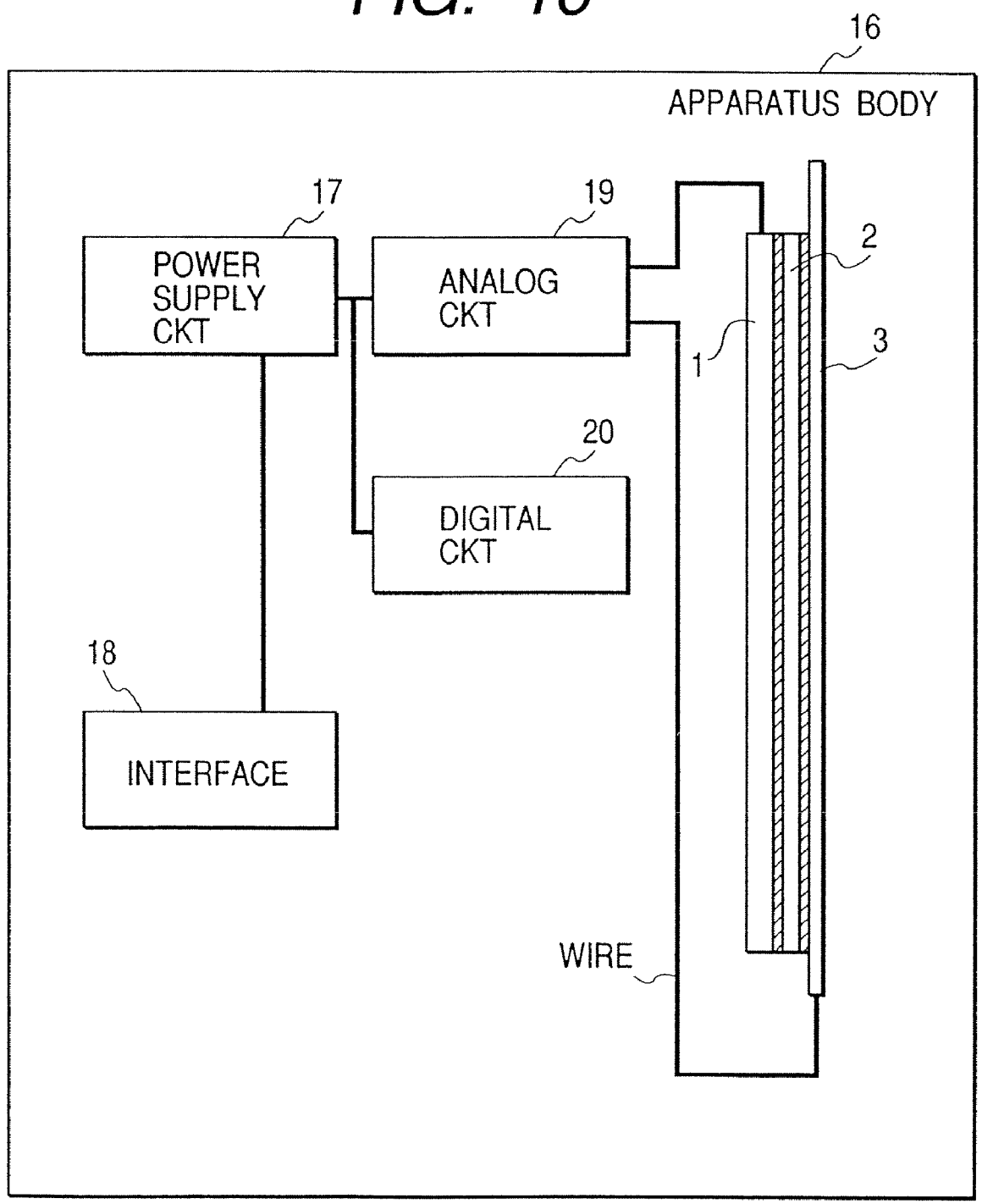
FIG. 10 is a schematic block diagram for explaining still another example of electrical connection of a conductive member.

FIG. 10 is a schematic block diagram to show an example where the earth terminal is connected to the analog circuit 19. In the example illustrated in FIG. 10, the thin metal sheet 3 of the photoelectric conversion device is connected to the ground wire of the analog circuit 19 as the earth. This is also suitably applicable to the cases where the photoelectric conversion device is disposed close to the analog circuit 19 or where the two devices have an equal operational earth potential.

As described above, the device has the mounting structure wherein the thin metal sheet 3 for prevention of radiation noise is stuck on the upper portion of the photoelectric conversion element 1 after completion of the photoelectric conversion element substrate. It is preferred that the thin metal sheet 3 be formed in a thinner thickness in order to decrease the X-ray losses and be stuck in the laminate form on the both sides in order to avoid formation of wrinkle or stripe. The total area of the thin metal sheet 3 is greater than the surface of the photoelectric conversion element 1 and the earth connecting portion is provided in the portion outside the region where the photoelectric conversion element is positioned; whereby the earth connecting portion can be connected to the earth terminal through the eyelet or screw at the position where the surface of the photoelectric conversion element 1 is not affected, thereby achieving connection to the earth or to the electric ground. This can effectively remove the radiation noise by the low-cost and simple mounting structure and also improve the yield of product.

The following description will mainly concern protection of the fluorescent member as a wavelength converting member. The material for the wavelength converting member such as the fluorescent member can be properly selected depending upon its use, purpose, and so on. For example, CsI can highly increase the efficiency of wavelength-converting X-rays to visible light, but it still has some room for improvement in resistance to external factors such as water and so on. The following description is extremely useful from the aspect of substantially improving the resistance as well.

Figure 11:
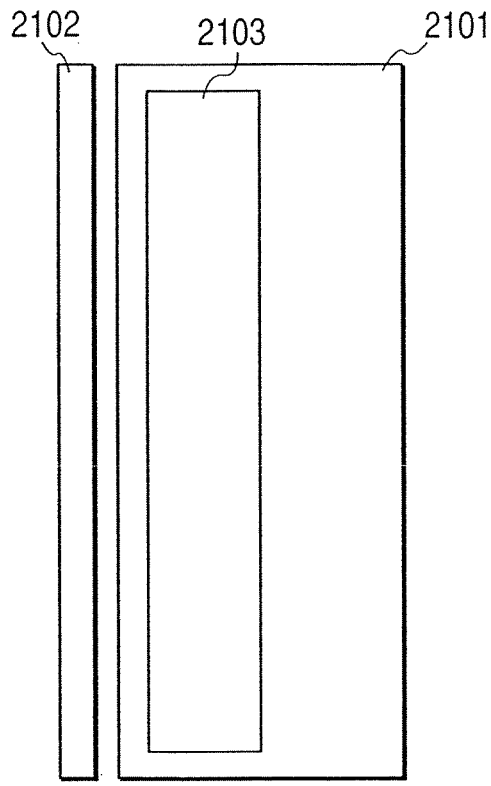
FIG. 11 is a schematic, structural view for explaining an example of arrangement of a photoelectric conversion device when applied to an X-ray imaging apparatus.

FIG. 11 is a schematic, structural view for explaining an example where the photoelectric conversion device as shown in FIG. 2 is used in an X-ray imaging apparatus.

In FIG. 11, reference numeral 2101 designates a housing, 2102 a grid, and 2103 the photoelectric conversion device. Although not illustrated in FIG. 11, an X-ray source is located on the left side of the figure and X-rays passing through an object (an object to be examined by nondestructive examination, for example, a man or an article) placed between the X-ray source and the grid 2102 pass via the grid 2102 and through the housing 2101 to enter the photoelectric conversion device 2103. The X-rays enter the fluorescent screen of the photoelectric conversion device 2103 to be converted to light including wavelengths in the photosensitive region of the photoelectric conversion element as described above. The light thus obtained by the conversion can be photoelectrically converted to obtain information according to the X-rays transmitted by the object as electric information.

The grid 2102 is provided in order to prevent X-rays scattered inside the object from entering the photoelectric conversion device.

Figure 12:
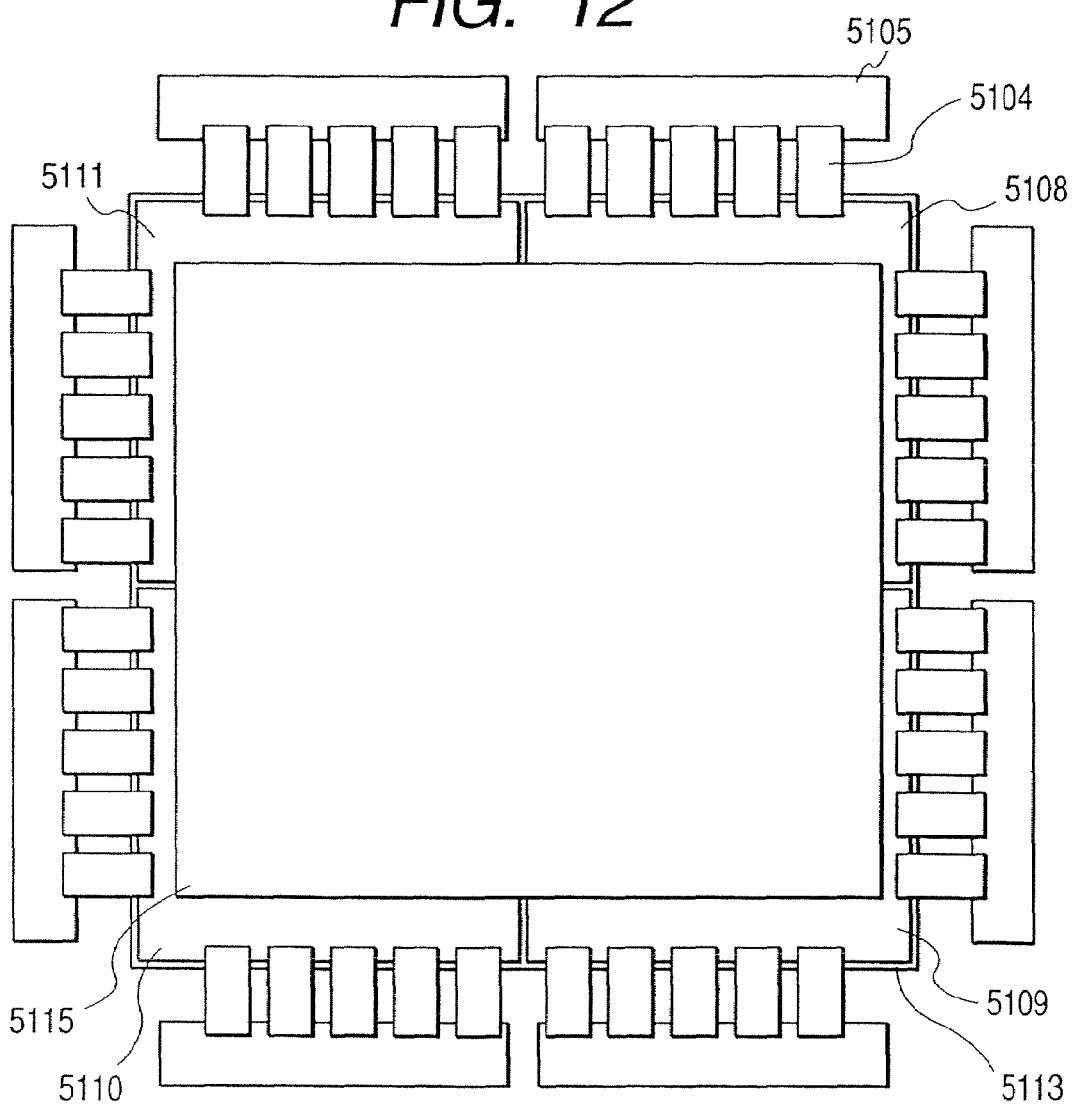
FIG. 12 is a schematic, plan view of a photoelectric conversion device.
Figure 13:
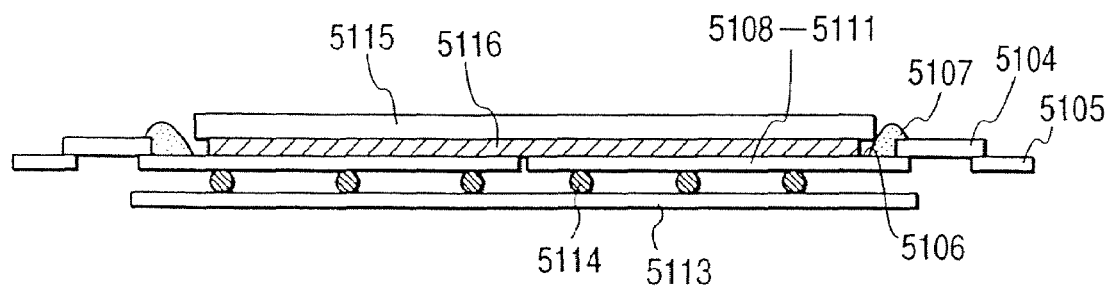
FIG. 13 is a schematic, cross-sectional view of the device shown in FIG. 12.

FIG. 12 is a schematic, plan view of an X-ray sensor portion and FIG. 13 is a schematic, cross-sectional view of the X-ray sensor portion. Numeral 5104 denotes flexible circuit boards, 5105 printed-circuit boards, 5106 leader electrode portions disposed on the sensor substrate, and 5107 a sealing material. In the joint portions between the leader electrode portions and the flexible circuit boards, the sealing material is provided for the purpose of anticorrosion of the leader electrodes. Numerals 5108 to 5111 represent sensor substrates on the top surface of which sensor elements are formed, numeral 5113 a base for supporting the sensor substrates, and 5114 an adhesive for securing the sensor substrates on the base. The sensor substrates 5108 to 5111 are positioned so as to match pixel pitches in two-dimensional directions and are fixed on the base. Numeral 5115 designates a fluorescent member for converting X-rays to visible light and 5116 an adhesive for laminating the fluorescent member to the sensor substrates. X-rays traveling from the X-ray source through the object into the fluorescent member are converted to the visible light in the fluorescent member. The visible light after conversion passes through the adhesive immediately below the fluorescent member to reach the sensor elements formed on the sensor substrates. This is photoelectrically converted to be outputted as a two-dimensional image.

Figure 14:
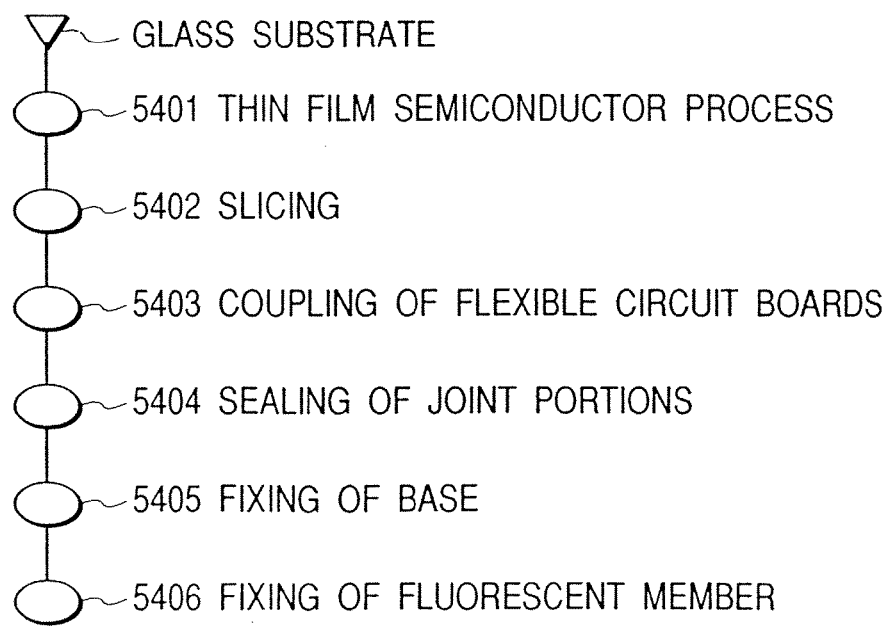
FIG. 14 is a schematic flowchart for explaining an example of a process for producing a photoelectric conversion device.

FIG. 14 is a process diagram to show an example of steps for producing the X-ray sensor portion shown in FIGS. 12 and 13. A sensor substrate 5108 to 5111 produced by the thin film semiconductor process is first sliced in the required size by a rotary diamond blade or the like (5401). Then the printed circuit boards are attached through the flexible circuit boards to the leader electrodes of the sensor substrates 5108 to 5111 of the required size (5402). Then the flexible circuit boards are jointed on the leader electrodes (5403) and in that state the sealing agent 5107 is applied so as to encapsulate the joint portions, through a dispenser or the like (5404). The four sensor substrates thus sealed are positioned so as to match the pixel pitches in the two-dimensional directions and are fixed by mounting each substrate on the base 5113 preliminarily coated with the adhesive 5114 (5405). After that, the fluorescent member 5115, the entire surface of which is coated with an adhesive or a pressure sensitive adhesive 5116 by spraying or the like, is mounted on the four sensor substrates 5108 to 5111 and is stuck thereto by applying a constant pressure thereon by a roller (5406).

As described above, in the case where a sufficient size cannot be obtained by use of one sensor substrate, it is preferable to form a pseudo single substrate by arranging a plurality of sensor substrates while matching the pixel pitches in the two-dimensional directions as described above. Accordingly, in the slicing step (5401) as shown in FIG. 14, it is preferable to pay close attention to points such as device breakage and corrosion due to chipping of the insulating film and protective film on the sensor substrates, caused by burrs or chips produced during slicing. The insulating film and protective film of the sensor substrates cover the sensor element portion, the thin-film transistor portion, the gate wires, and the signal wires, so as to prevent water or ions of impurities such as sodium, potassium, or chlorine from intruding into the semiconductor layers or the metal layer, thereby preventing corrosion of the metal wire. However, if in the slicing step the insulating film or the protecting film is damaged to be chipped because of the burrs or chips produced during slicing, there are possibilities that the water and impurity ions will intrude into the interface between the insulating film and the transparent insulating substrate to cause corrosion of wire. Such corrosion of wire could finally result in breaking of wire. This will result in, for example, line defects in an image, thus significantly degrading the quality of image.

Further, in the above described steps of aligning a plurality of (for example four) sensor substrates while matching the pixel pitches in the two-dimensional directions, and placing and fixing each substrate on the base preliminarily coated with the adhesive or pressure sensitive adhesive and of then placing the fluorescent member the entire surface of which is coated with the adhesive by spraying or the like, on the four sensor substrates and sticking the fluorescent member thereon by applying the constant pressure thereon by the roller, it is also desirable to pay attention to the points of the device breakage and corrosion caused by chipping or breakage of the insulating film or the protective film on the sensor substrates because of the so-called dust including particles and chips captured during the sticking.

As described above, if there is chipping up to the vicinity of the gate wires due to the chipping or breakage of the insulating film or the protective film on the sensor substrates due to the dust, pixel defects could occur and water and impurity ions could intrude into the interface between the insulating film and the transparent insulating substrate to cause wire corrosion. The configurations of the present invention also solve such a problem.

The present invention can also protect the fluorescent member as the wavelength converting member at the same time. These points will be described in further detail by reference to the drawings.

Figure 15:
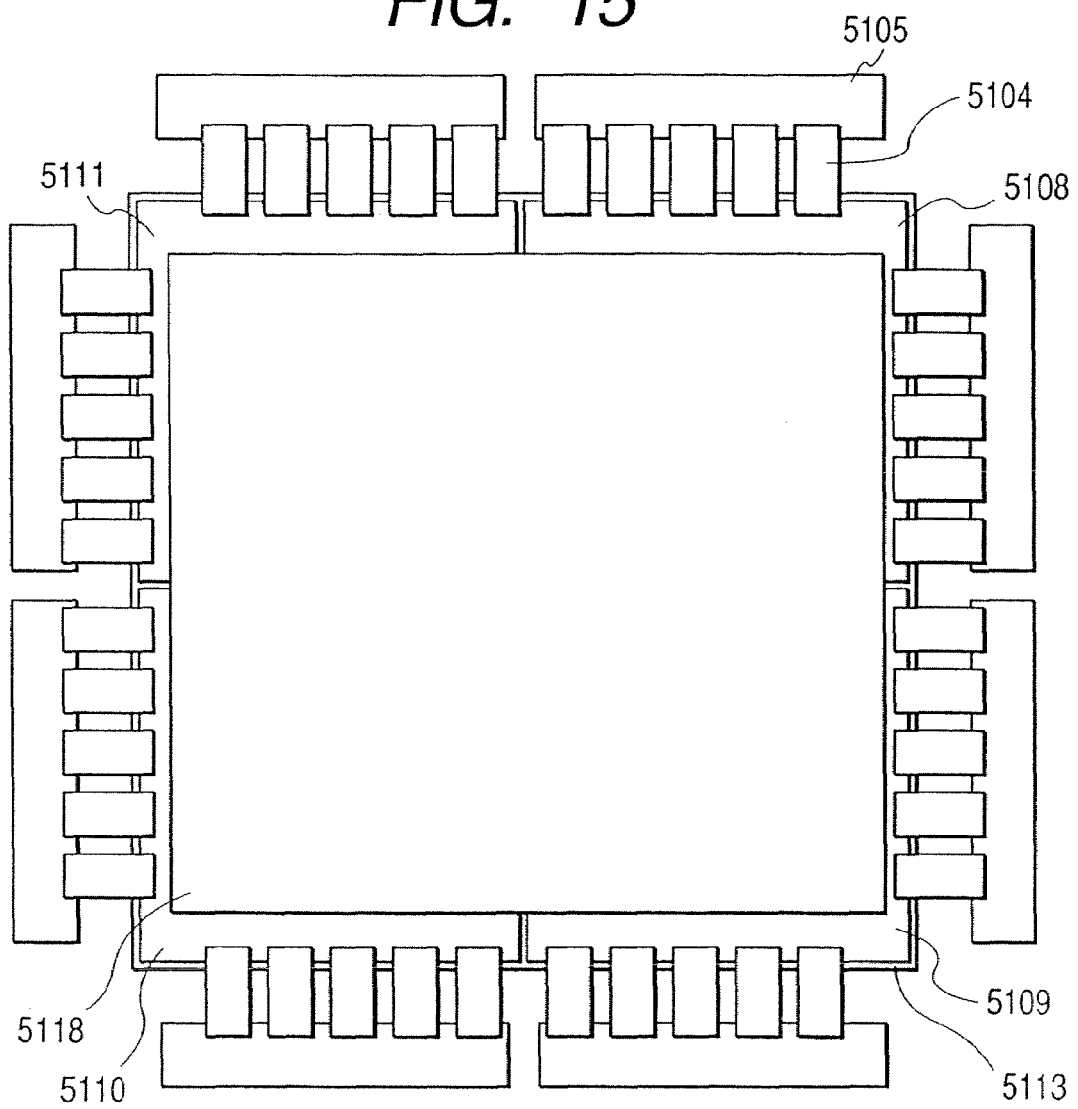
FIG. 15 is a schematic, plan view of another photoelectric conversion device.
Figure 16:
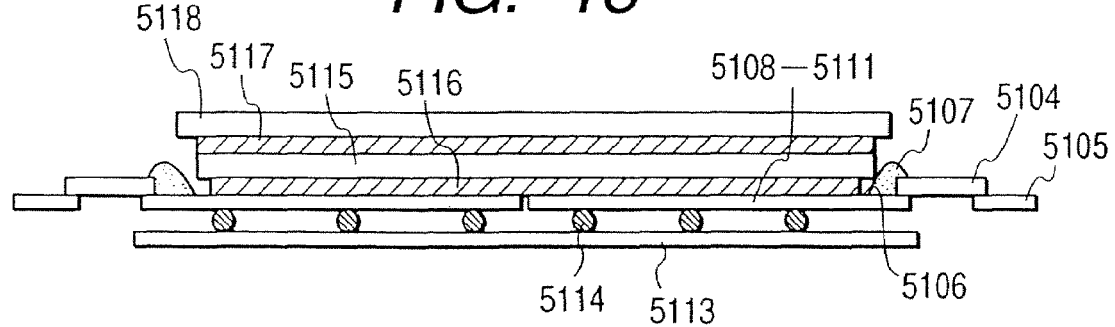
FIG. 16 is a schematic, cross-sectional view of the device shown in FIG. 15.

A photoelectric conversion device of the present invention has a metal foil (a thin metal sheet) formed on the fluorescent member 5115 shown in FIG. 12 and FIG. 13. In this case, the metal acts as a barrier against water and unwanted ions. Therefore, it can protect the semiconductors in the photoelectric conversion portion and so on and the metal wires from the negative effects. At the same time, the water and unwanted ions are prevented from intruding into the fluorescent member as the wavelength converting member. An example of the photoelectric conversion device provided with the metal foil is shown in FIG. 15 and FIG. 16.

The intrusion of water also occurs through the interface between the substrates on which the photoelectric conversion elements are formed, and the metal wiring layer, insulating layer, semiconductor layers, or the like which form the photoelectric conversion elements, or through the interfaces between the respective layers.

Figure 17:
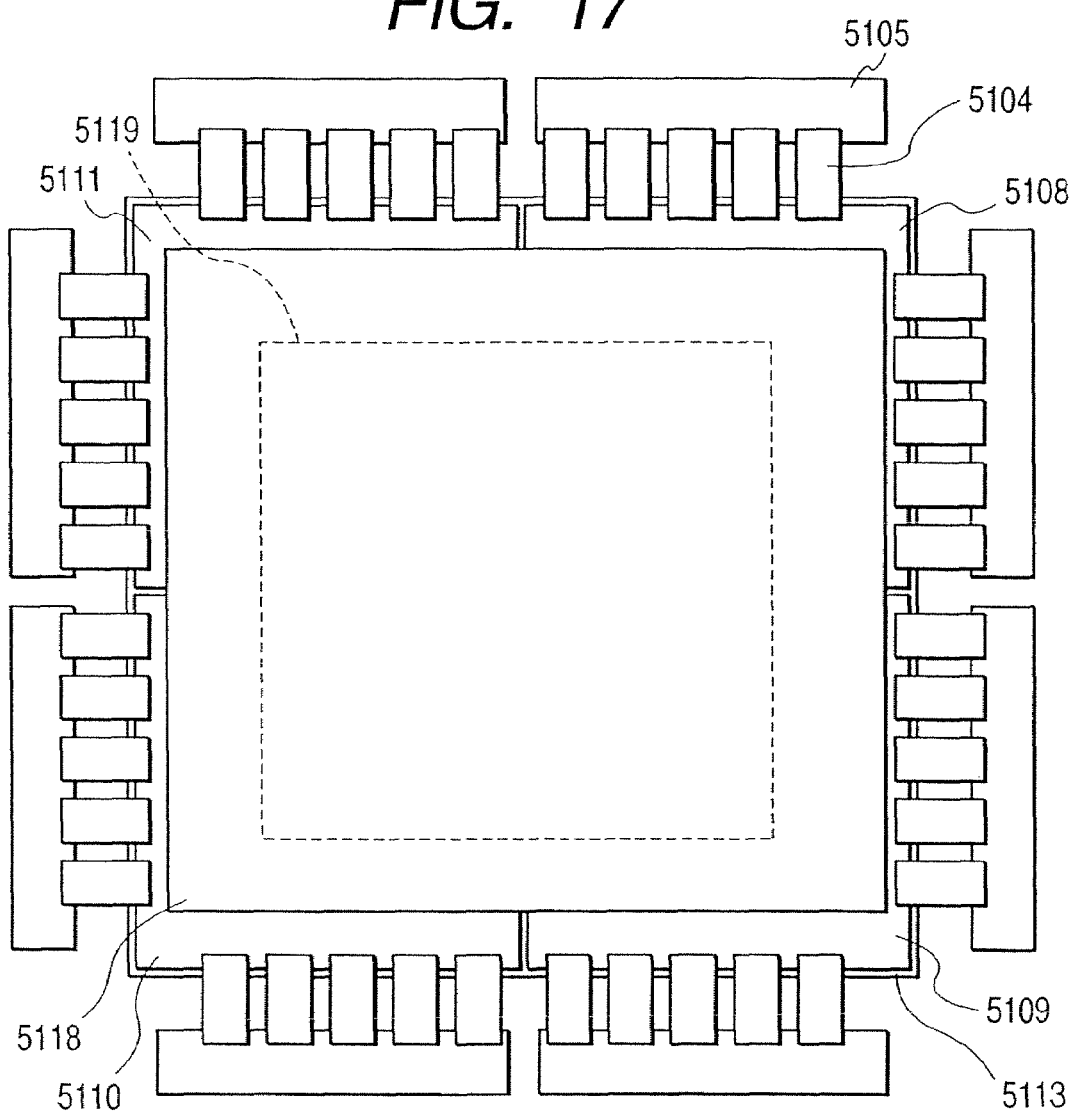
FIG. 17 is a schematic, plan view of still another photoelectric conversion device.
Figure 18:
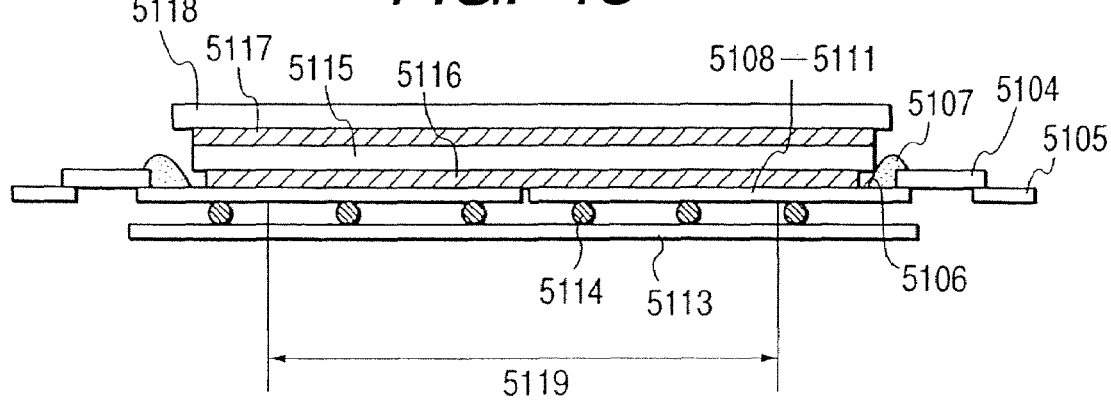
FIG. 18 is a schematic, cross-sectional view of the device shown in FIG. 17.

It is thus preferred to locate the device forming region 5119 for the photoelectric conversion portion and so on sufficiently inside the periphery of the thin metal sheet (metal foil) 5118, as shown in FIGS. 17 and 18.

This is because the above arrangement increases the distance from the periphery where the intrusion occurs easily in particular, whereby the time necessary for the water and the like to reach the device forming region 5119 can be lengthened so as to pose no problem in practical use.

By increasing the size of the thin metal sheet 5118 sufficiently in this way, the countermeasure against the radiation noise can also be achieved efficiently.

For making the device in the shape having the desired distance to the edge as shown in FIG. 17 and FIG. 18, the scale of the entire device becomes larger in order to impart sufficient durability thereto. Described below is an example of the structure having further enhanced durability while taking further account of this point.

Figure 19:
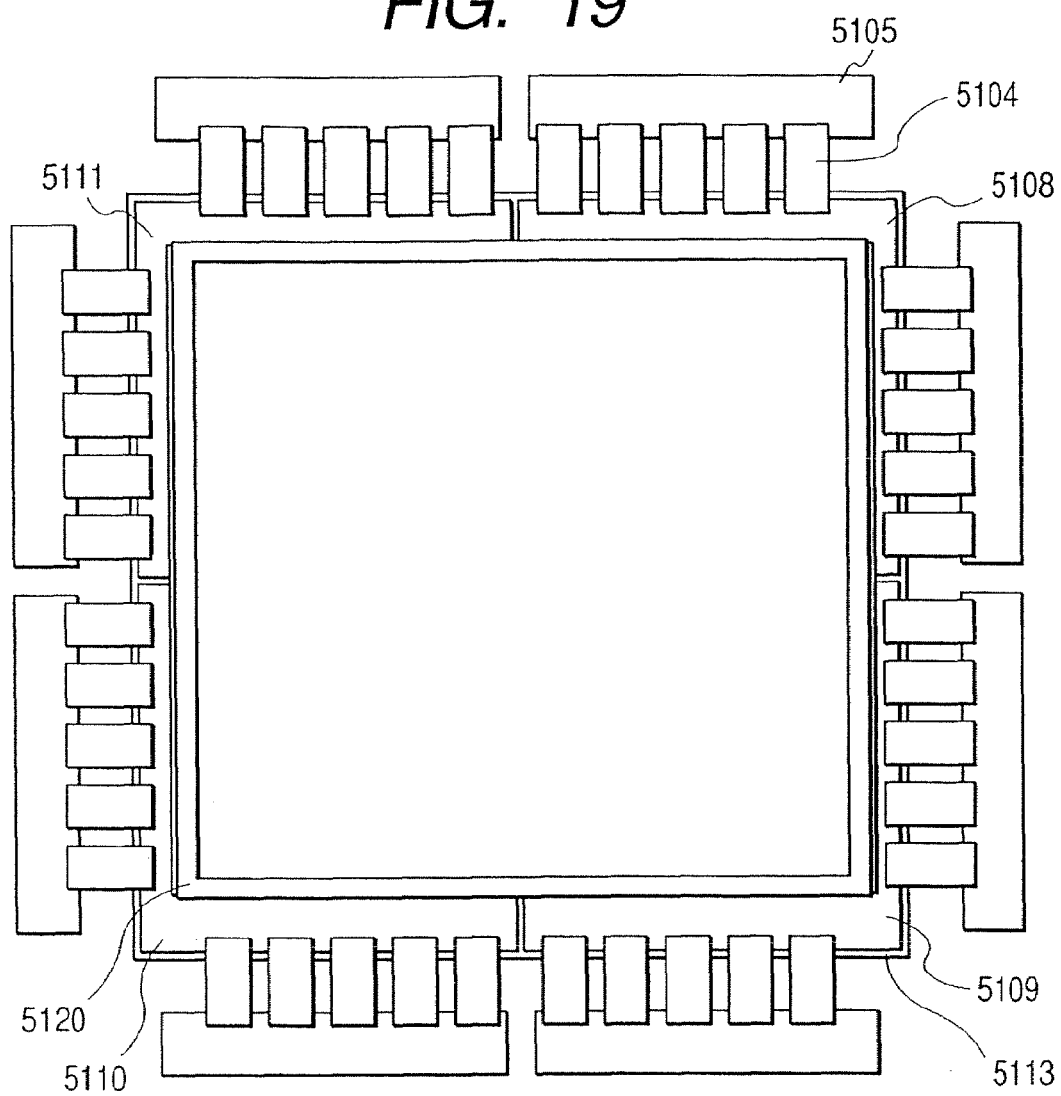
FIG. 19 is a schematic, plan view of yet another photoelectric conversion device.
Figure 20:
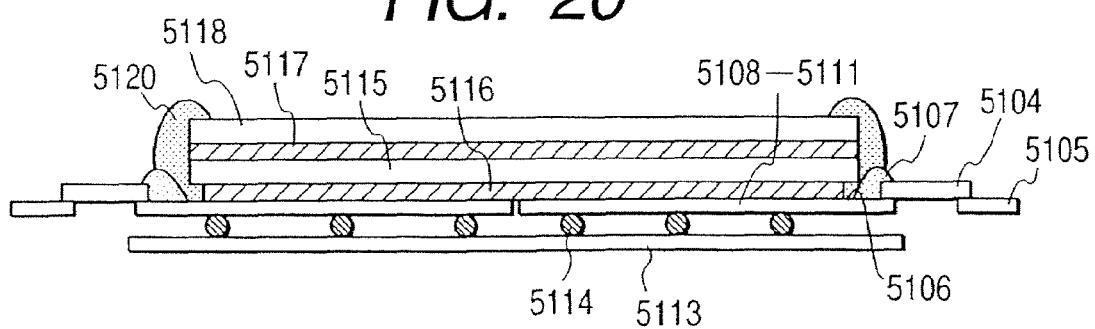
FIG. 20 is a schematic, cross-sectional view of the device shown in FIG. 19.

The photoelectric conversion device shown in FIG. 19 and FIG. 20 is basically a modification of the photoelectric conversion device shown in FIG. 15 and FIG. 16, in which the periphery (the circumference) of the thin metal sheet 5118 is sealed with a sealing material 5120 of an organic resin or inorganic material.

This can prevent the intrusion of water or the like for a period in which the water or the like passes through this sealing material 5120.

Figure 21:
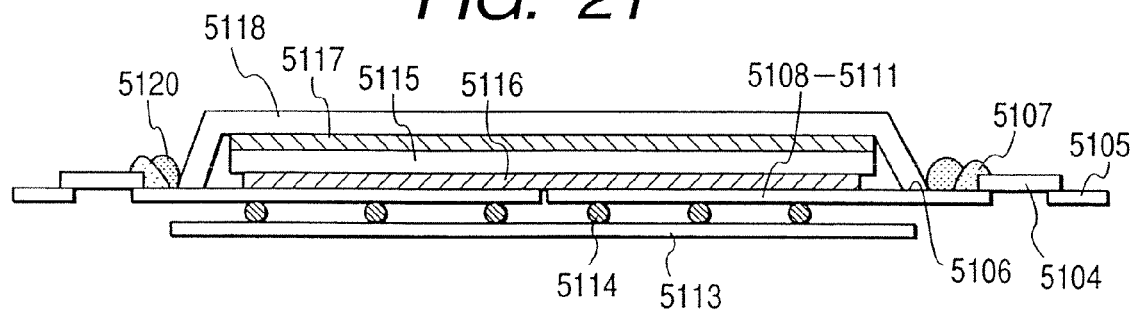
FIG. 21 is a schematic, cross-sectional view for explaining another example of a photoelectric conversion device.

FIG. 21 shows only a schematic, cross-sectional view, in which the periphery of the thin metal sheet 5118 is bent to be stuck and/or sealed with a resin on parts of the sensor substrates.

In the example shown in FIG. 21 the durability is further enhanced because of the space established between the thin metal sheet 5118 and the fluorescent member and photoelectric conversion elements. Further, by filling this space with a resin, the durability will be enhanced more.

Figure 22:
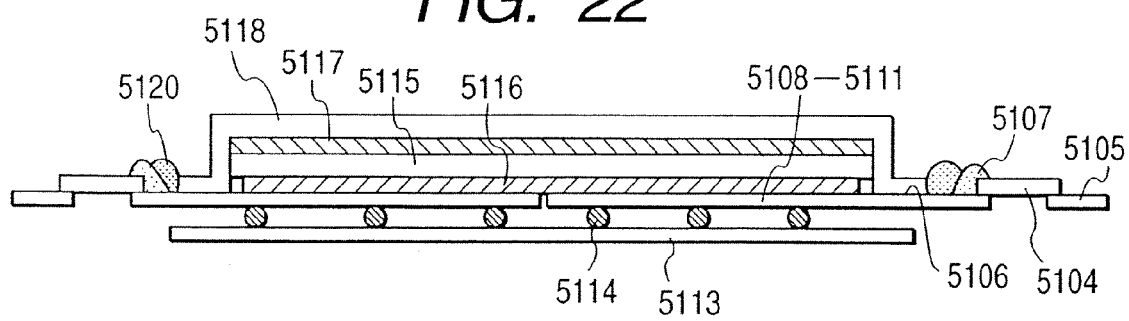
FIG. 22 is a schematic, cross-sectional view for explaining still another example of a photoelectric conversion device.

FIG. 22 shows an example in which projecting portions of the thin metal sheet 5118 outside the fluorescent member are bent at right angles along the edge of the fluorescent member to be shaped in such a right-angle bent form as to keep the thin metal sheet 5118 in contact with the circumference of the sensor substrates having the sensor elements formed therein and subjected to sticking, and in which the periphery is sealed with a sealing material 120 of an organic resin or inorganic material.

Since in this example the edge-face parts of the fluorescent member are covered by the metal, water and the like can be prevented from intruding into the fluorescent member and the durability of the fluorescent member can be enhanced more.

It is a matter of course that the thin metal sheets 5118 shown in FIG. 15 to FIG. 22 may have a resin material or inorganic material as the base and/or the protective layer as described above.

Sticking of the thin metal sheet 5118 on the fluorescent member 5115 is preferably carried out by using a material 5117 which is the same material or of the same family as the pressure sensitive adhesive and/or the adhesive used in sticking of the fluorescent member 5115 on the photoelectric conversion portion.

As described above, according to the present invention, in a photoelectric conversion device having a photoelectric conversion element, by adopting the configuration wherein a thin metal sheet is stuck on a surface of the photoelectric conversion element and wherein the metal sheet is connected to an earth terminal to remove the radiation noise, it becomes possible to surely prevent the effect of radiation noise while improving the yield by a low-cost and simple mounting structure without employing the expensive film forming process.

Further, according to the present invention, there can be provided a low-cost photoelectric conversion device and an X-ray image reading device with excellent resistance to radiation noise.

Further, according to the present invention, by adopting the constitution in which the thin metal sheet is prepared so as to have a larger area than that of the surface of the photoelectric conversion element and has the earth connecting portion provided therein; the both sides of the thin metal sheet are laminated with a resin; and the earth connecting portion is fixed to the earth terminal by use of a screw, eyelet, and so on to be connected to the ground of the apparatus body, the digital circuit, or the analog circuit; it becomes possible to realize the simple mounting of sticking the thin metal sheet on the surface of the photoelectric conversion element to bring them into close contact with each other, so that grounding at any suitable position can be effected.

In addition, according to the present invention, it becomes possible to provide a photoelectric conversion device with high humidity resistance, excellent resistance to impurity ions, and high durability.

It is needless to mention that the present invention is by no means limited to the above examples but may embrace a variety of modifications and combinations within the spirit and scope of the invention.

What is claimed is:

1. An imaging apparatus comprising:
    a photoelectric conversion device having a plurality of photoelectric conversion elements on an area of a surface of a substrate;
    a grounded conductive member arranged over said area of the surface of the substrate; and
    a wavelength converting member arranged between the grounded conductive member and the photoelectric conversion elements,
    wherein the grounded conductive member has a metal layer disposed on a base, and is fixed with an adhesive to the wavelength converting member, said grounded conductive member extending over and beyond a region in which the plurality of photoelectric conversion elements and the wavelength converting member are arranged.

2. The imaging apparatus according to claim 1, wherein the wavelength converting member comprises a fluorescent member.

3. The imaging apparatus according to claim 1, wherein a periphery of the conductive member is sealed.

4. The imaging apparatus according to claim 1, wherein the plurality of photoelectric conversion elements are arranged in a matrix.

5. The imaging apparatus according to claim 1, wherein the apparatus comprises a plurality of said substrates arranged in two-dimensional directions, said substrates facing said grounded conductive member with said wavelength converting member interposed therebetween.

6. The imaging apparatus according to claim 5, wherein the plurality of said substrates face a single said grounded conductive member.

7. The imaging apparatus according to claim 1, further comprising a plurality of lead electrode portions disposed on the surface of said substrate.

8. The imaging apparatus according to claim 7, further comprising a control circuit connected to said lead electrode portions.

9. The imaging apparatus according to claim 1, wherein the metal comprises aluminum.

10. The imaging apparatus according to claim 1, wherein the grounded conductive member covers an area broader than said region in which the plurality of photoelectric conversion elements and the wavelength converting member are arranged.

11. The imaging apparatus according to claim 10, wherein a space is formed between the outer edge of the substrate and the conductive member.

12. The imaging apparatus according to claim 1, further comprising a resin that seals at least a portion of the surface of the substrate and at least a part of an end face of the conductive member, wherein the surface of the substrate and the conductive member are in close proximity with each other, and wherein an edge portion of said conductive member is sealed so as to cover the outer edges of the substrate.

13. The imaging apparatus according to claim 12, wherein the resin is provided so as to cover a peripheral portion of the substrate and all the end faces of the conductive member.

14. The imaging apparatus according to claim 1, wherein the grounded conductive member has a ground connecting portion outside of an area thereof facing the region in which the plurality of photoelectric conversion elements and the wavelength converting member are arranged.

15. The imaging apparatus according to claim 1, wherein the wavelength converting member is sealed between the substrate and the grounded conductive member, wherein the grounded conductive member forms a seal outside of said region in which the plurality of photoelectric conversion elements and the wavelength converting member are arranged.

16. The imaging apparatus according to claim 15, wherein the seal further includes a resin.

17. The imaging apparatus according to claim 1, wherein the grounded conductive member has at least one surface thereof that forms a sealing film.

18. The imaging apparatus according to claim 1, wherein a periphery of the conductive member extends over the outer edges of the substrate.

19. An imaging apparatus comprising:
- a photoelectric conversion device having a plurality of photoelectric conversion elements on an area of a surface of a transparent insulating substrate;
- a grounded conductive member arranged over said area of the surface of the transparent insulating substrate; and
- a wavelength converting member arranged between the grounded conductive member and the photoelectric conversion elements,
- wherein the grounded conductive member has a metal layer disposed on a base and is fixed with an adhesive to the wavelength converting member, said grounded conductive member extending over and beyond a region in which the plurality of photoelectric conversion elements and the wavelength converting member are arranged, and
- wherein the photoelectric conversion elements comprise a-Si.

20. A method of manufacturing an imaging apparatus including a photoelectric conversion device having a plurality of photoelectric conversion elements on an area of a surface of a substrate, a grounded conductive member arranged over said area of the surface of the substrate, and a wavelength converting member arranged between the grounded conductive member and the photoelectric conversion elements, comprising the steps of:
- fixing the grounded conductive member to the wavelength converting member by an adhesive,
- forming the grounded conductive member of a thin metal sheet fixed on a base, and
- extending the grounded conductive member over and beyond a region in which the plurality of photoelectric conversion elements and the wavelength converting member are arranged.

* * * * *